(12) United States Patent
Mehrotra et al.

(10) Patent No.: US 7,332,974 B1
(45) Date of Patent: Feb. 19, 2008

(54) METHOD AND APPARATUS FOR STEADY STATE ANALYSIS OF A VOLTAGE CONTROLLED OSCILLATOR

(75) Inventors: Amit Mehrotra, Mountain View, CA (US); Amit Narayan, San Carlos, CA (US)

(73) Assignee: Berkeley Design Automation, Inc., Santa Clara, CA (US)

( * ) Notice: Subject to any disclaimer, the term of this patent is extended or adjusted under 35 U.S.C. 154(b) by 0 days.

(21) Appl. No.: 11/045,241

(22) Filed: Jan. 27, 2005

(51) Int. Cl.
*G06F 17/50* (2006.01)
*G01R 23/06* (2006.01)
(52) U.S. Cl. .......................... 331/44; 703/14; 708/804
(58) Field of Classification Search ................. 331/44; 703/14; 708/804
See application file for complete search history.

(56) References Cited

U.S. PATENT DOCUMENTS 5,867,416 A * 2/1999 Feldmann et al. .......... 708/801
6,154,716 A * 11/2000 Lee ................................ 703/2
2003/0046045 A1 * 3/2003 Pileggi et al. .................. 703/4
2003/0065493 A1 * 4/2003 Neubert et al. ................ 703/2

* cited by examiner

*Primary Examiner*—Robert Pascal
*Assistant Examiner*—James Goodley
(74) *Attorney, Agent, or Firm*—Fenwick & West LLP

(57) ABSTRACT

A computer-implemented method computes the steady-state and control voltage of a voltage controlled oscillator, given a known frequency or a known period of oscillation of the voltage controlled oscillator. Differential algebraic equations representative of the voltage controlled oscillator are generated, where the differential algebraic equations includes a known period or frequency of oscillation and an unknown control voltage of the voltage controlled oscillator. The differential algebraic equations are modified using a finite difference method, a shooting method, or a harmonic balance method, to obtain a set of matrix equations corresponding to the differential algebraic equations. A solution to the matrix equations is obtained using a Krylov subspace method, using a preconditioner for the Krylov subspace method that is derived from a Jacobian matrix corresponding to the matrix equations, where the solution includes the control voltage of the voltage controlled oscillator in steady state.

15 Claims, 5 Drawing Sheets

METHOD AND APPARATUS FOR STEADY STATE ANALYSIS OF A VOLTAGE CONTROLLED OSCILLATOR

TECHNICAL FIELD

The present invention relates to computer-aided analysis of electronic circuits and, more specifically, to computer-aided steady state analysis of voltage controlled oscillators.

BACKGROUND OF THE INVENTION

An oscillator is a widely used electronic circuit component that generates a periodic output voltage signal at a particular frequency. An oscillator is an autonomous circuit in the sense that the oscillator can generate a periodic output voltage signal by applying only constant bias signals to the oscillator, through a self-sustaining mechanism that causes repeated amplification of the oscillator's own noise that eventually becomes a large periodic voltage signal. When the amplitude of the oscillation reaches a predetermined level, another different mechanism of the oscillator limits further growth of the signal so that the amplitude of the oscillation maintains the predetermined level. The amplitude and frequency of the oscillation is usually determined by the properties of the oscillator and its surrounding circuitry.

Oscillators are extensively used in a variety of electronic circuits including microprocessors, digital signal processors, frequency synthesizers, and analog circuits with phase-locked loops (PLLs). In microprocessors and other digital system-on-chip (SOC) applications, oscillators are used for clock generation. In communication systems such as wireless local area networks (WLAN) and cellular telephone transceivers, oscillators are used for frequency translation of the information signal and for channel selection.

For a variety of applications, it is desirable to have a mechanism to adjust the frequency or period of oscillation of an oscillator. For example, if an oscillator is used to select a channel during the down conversion of a signal in a radio frequency (RF) transceiver, there is a need for the oscillator to operate at different frequencies at different times. If the output frequency of an oscillator can be varied by a control voltage of the oscillator, the oscillator is called a voltage controlled oscillator (VCO). On the other hand, if the output frequency of the oscillator can be controlled by varying a control current of the oscillator, the oscillator is called a current controlled oscillator. The term VCO herein can be applied to both the voltage controlled oscillator and the current controlled oscillator.

VCOs are commonly used in phase-locked loop circuits, which are also widely used in analog circuits such as wireless communication systems. FIG. 1 is a block diagram illustrating a typical phase-locked loop (PLL) 100 including a VCO 112. The PLL 100 includes an oscillator-frequency divider (OSC+FD) module 102, a phase detector (PD) module 108 comprised of a phase frequency detector (PFD) 104 and a charge pump (CP) 106, a low-pass filter (LF) 110, a VCO 112, and a frequency divider (FD) 114. The oscillator-frequency divider (OSC+FD) module 102 generates a reference signal (REF) 116. The phase detector (PD) 108 compares the phase of the reference signal (REF) 116 with the phase of a feedback signal (FB) 118. The difference in the phases of the reference signal (REF) 116 and the feedback signal (FB) 118 is filtered by a low-pass filter (LF) 110, and the filtered phase difference signal 122 is applied to the controlling node of the VCO 112. The VCO 112 outputs a signal 128 at a locked frequency determined by the voltage of the filtered phase difference signal 122 at the controlling node of the VCO 112. Therefore, in analyzing PLLs, it is important to determine the behavior of the VCO 112, including the control voltage of the VCO 112.

Because oscillators are commonly used in electronic circuits, the analysis of the operation of oscillators is also important in understanding and simulating the behavior of a given electronic circuit. Specifically, the steady state analysis of electronic circuits and oscillators is of interest in circuit simulation. In circuit simulation, a circuit is typically characterized using a set of differential algebraic equations (DAEs). The steady state solution of a DAE is the asymptotic solution of the system as the effect of an initial condition dies out.

There are different types of steady state behaviors that are of interest in analyzing a circuit. One of such steady state behaviors is the DC operating point of the circuit, which provides the voltages and currents at various circuit nodes when the circuit is driven by time-dependent constant excitations. This DC operating point of the circuit can be analyzed using conventional circuit simulation software such as SPICE.

Another type of steady state behavior, the periodic steady state (PSS), is obtained when a circuit is driven by a set of periodic excitations. Since the circuit is driven by an external input and is not autonomous, the circuit steady state is response is also periodic with the same period as the period of the external input signal. However, oscillators achieve a periodic steady state when driven by constant excitations. Therefore, in the case of oscillators, as part of analyzing the steady state, the period of frequency of oscillation also needs to be calculated together with the voltages and currents associated with the oscillators.

A variety of conventional techniques exist for computing the steady state behavior of a VCO. However, all of these conventional techniques determine the steady state behavior of a VCO where the control voltage of the VCO is given (known) and the period of frequency of oscillation is unknown. In other words, it is assumed that the control voltage of the VCO is known and that the frequency of oscillators as well as the voltages at various nodes of the VCO needs to be computer for this given value of the control voltage.

For example, a well-known but error-prone conventional technique of determining the period of oscillation of a VCO is to run a dynamic transient simulation of the VCO circuit. If this simulation is run for a sufficiently long duration, the VCO circuit reaches its steady state. The period of oscillation can be estimated by measuring the difference in times when the output signal waveform of the VCO crosses a predetermined constant value for two consecutive times. However, this conventional technique is error prone, because it is difficult to verify whether the circuit has indeed reached a steady state for all the nodes in the VCO circuit.

Another conventional technique of determining the period of oscillation of a VCO is to computer the steady state by treating the period to be an unknown and computing this period together with all the node voltage/current waveforms of the circuit. Such conventional technique can be applied in both time domain and frequency domain. In time-domain, a widely used method is the Shooting-Newton method and in frequency-domain a widely used method is the Harmonic Balance method. However, this conventional technique also assumes that the control voltage of the VCO is known, and the period of frequency of oscillation is calculated as part of the algorithm.

So far, there has been non conventional technique of determining the control voltage of a VCO given a known period or frequency of oscillation of the VCO. One rudimentary way of determining the control voltage of a VCO given a known period or frequency of oscillation of the VCO is to calculate the control voltage for a given period using an iterative technique where the control voltage is assumed to be a certain value and the corresponding frequency or period of oscillation is computed. If the assumed value of the control voltage is swept in sufficiently small increments, in theory one can find the correct control voltage that leads to the given frequency of oscillation. However, this iterative technique is very inefficient, since it requires multiple, iteratively steady state computations of the VCO circuit to determine the correct control voltage.

Therefore, there is a need for determining the control voltage of a VCO given the frequency or period of oscillation of the VCO as part of the computation of the steady state solution of the VCO with the control voltage being an unknown variable. There is also a need for determining the control voltage of a VCO given the frequency or period of oscillation of the VCO in an efficient manner.

SUMMARY OF THE INVENTION

The present invention provides a computer-implemented method and a computer system for computing the steady-state and the control voltage (or control current) of a voltage controlled oscillator (VCO) given the desired (known) frequency or period of oscillation of the VCO. A set of one or more differential algebraic equations representative of the voltage controlled oscillator is generated, where the differential algebraic equations include a known period or a known frequency of oscillation of the voltage controlled oscillator and an unknown control voltage of the voltage controlled oscillator that generates the period or frequency of oscillation. The differential algebraic equations are modified to obtain a set of matrix equations corresponding to the differential algebraic equations, and a solution to the matrix equations is obtained using a Krylov subspace method, where the solution includes the control voltage of the VCO in steady state.

In one embodiment, the differential algebraic equations are modified using a finite difference method in time domain to obtain the matrix equations. In another embodiment, the differential algebraic equations are modified using a shooting method in time domain to obtain the matrix equations. In still another embodiment, the differential algebraic equations are modified using a harmonic balance method in frequency domain to obtain the matrix equations. In still another embodiment, a Jacobian matrix corresponding to the matrix equations is obtained, and the matrix equations are solved using a preconditioner for the Krylov subspace method that is derived at least in part from the Jacobian matrix.

The steady state analysis of a VCO according to the present invention has the advantage that the steady state and the control voltage that result in a given frequency or period of oscillation can be efficiently computed. Unlike conventional steady state analysis of VCOs that cannot calculate the control voltage directly, the present invention provides a way of computing the control voltage and steady state directly with short run-time and in an accurate manner.

BRIEF DESCRIPTION OF THE DRAWINGS

The teachings of the present invention can be readily understood by considering the following detailed description in conjunction with the accompanying drawings. Like reference numerals are used for like elements in the accompanying drawings.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF EMBODIMENTS

Figure 1:
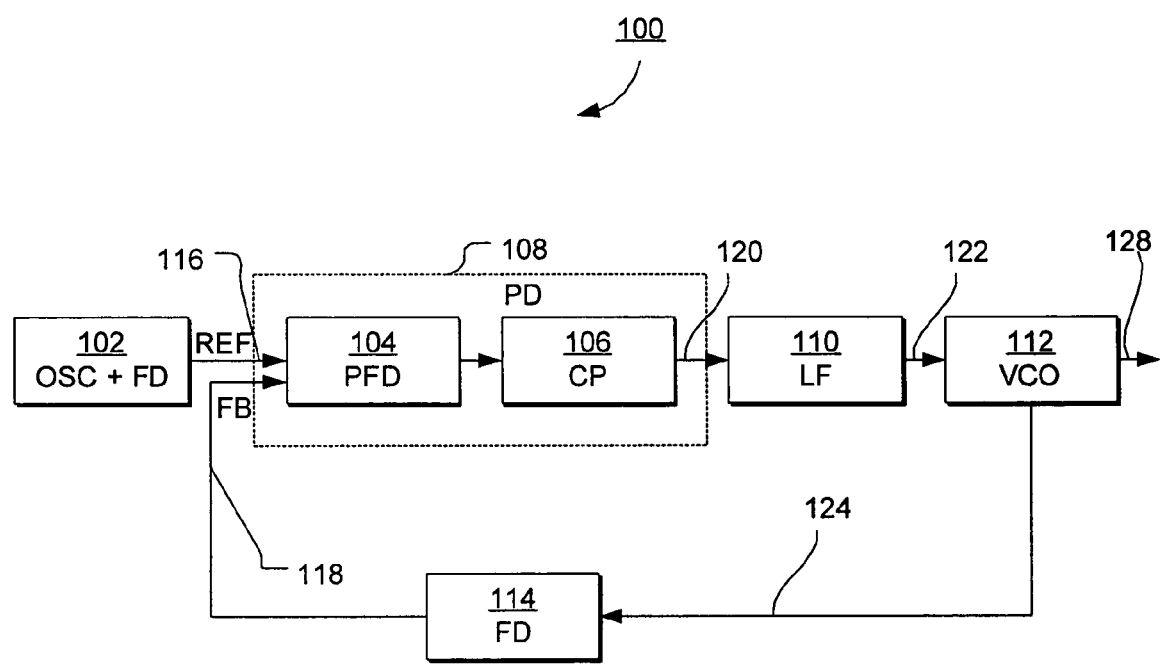
FIG. 1 is a block diagram illustrating a typical phase-locked loop including a VCO.
Figure 2:
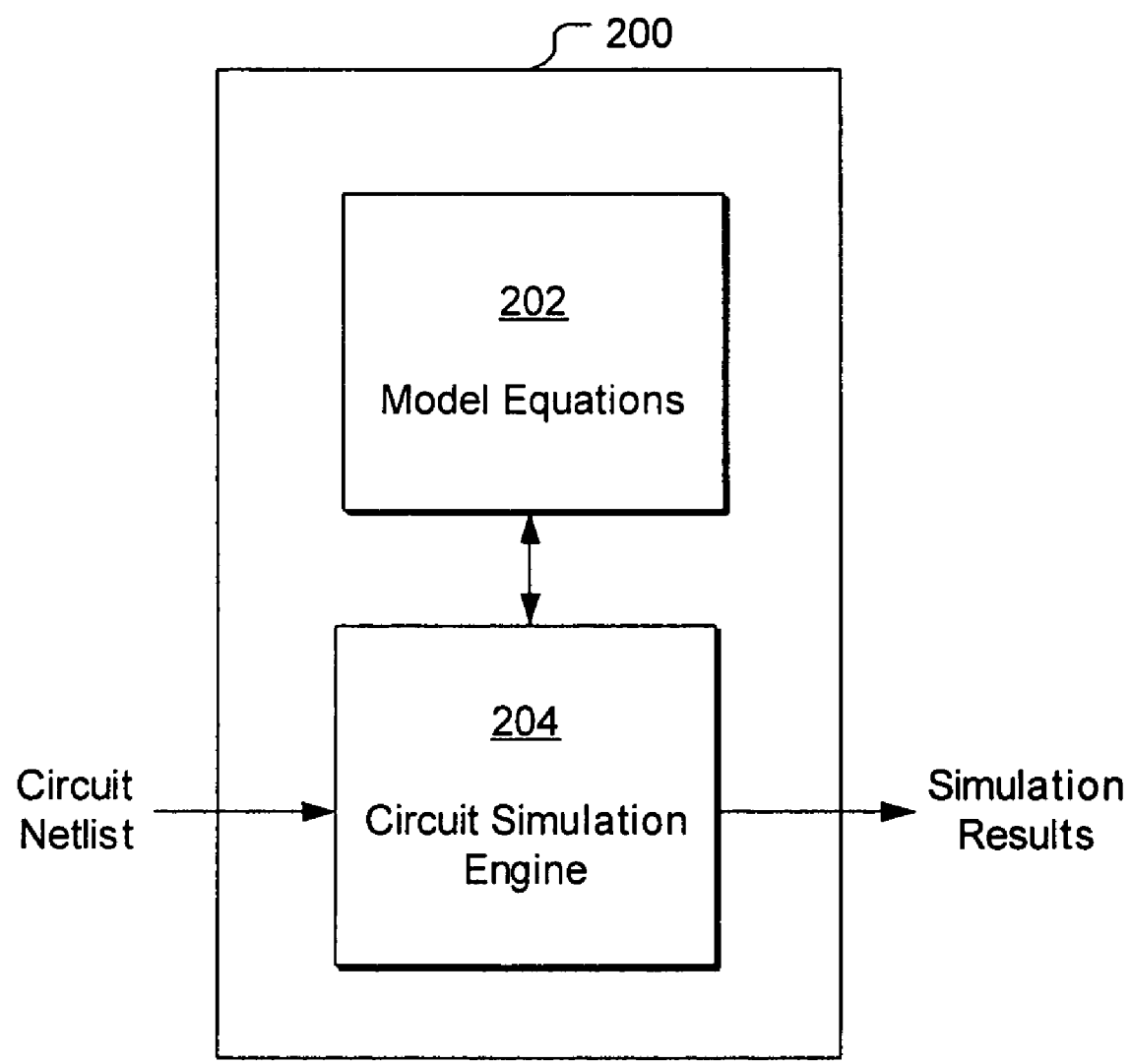
FIG. 2 is a block diagram illustrating a circuit simulation system, according to one embodiment of the invention.

FIG. 2 is a block diagram illustrating a circuit simulation system 200, according to one embodiment of the invention. The circuit simulation system 200 includes a circuit simulation engine 204 and a database 202 of model equations coupled to the circuit simulation engine. The circuit simulation system 200 is typically circuit simulation software running on a computer. The model equations database 202 includes analytical models modeling the behavior of a variety of circuit components (e.g., capacitor, inductors, transistors, diodes, etc.) that are typically included in electronic circuits, for use in generating DAEs representing the circuit to be simulated. The circuit simulation engine 204 is configured to receive a circuit netlist describing the nodes and connections of the electronic circuit to be simulated, generate DAEs representing the circuit based on the netlist and the model equations, and execute a variety of algorithms for solving the DAEs. For example, the circuit simulation engine 204 is configured to perform the methods of computing the steady state and control voltage of a VCO as set forth below and in FIGS. 3-5. The circuit simulation engine 204 typically outputs the simulation results for further analysis.

The steady state analysis of a VCO according to the present invention can be better understood by first understanding the periodic steady-state analysis of a non-autonomous circuit in general and the periodic steady-state analysis of an oscillator in general.

Periodic Steady-State Analysis of a Non-Autonomous Circuit

Consider a non-autonomous circuit which can be modeled by a DAE given by:

$$\frac{dq(x(t))}{dt} + f(x(t)) + b(t) = 0 \quad (1)$$

The independent sources of the non-autonomous circuit are assumed to be periodic with a period T. Since the circuit is non-autonomous, the steady-state response x(t) of the circuit, where t represents time, will also be periodic with period T. Here, q(x(t)) and f(x(t)) represent the variables of the non-autonomous circuit that are functions of the steady-state response x(t), while b(t) represent the variables of the non-autonomous circuit that are not functions of the steady-state response x(t). Direct methods of computing the steady state response are the finite different method and the shooting method which are in time-domain and the harmonic balance method which are in frequency domain.

Periodic Steady-State Analysis of a Non-Autonomous Circuit Using Finite Difference Method First, the time period [0, T] is discretized into n steps $t_0, t_1, \ldots, t_n$ where $t_0=0$ and $t_n=T$. Further, define $h_i = t_i - t_{i-1}$. Note that these times steps $t_0, t_1, \ldots, t_n$ need not be equal. Equation (1) can be rewritten on each of these time steps by discretizing the differential operator using the Backward-Euler method, for example:

$$\frac{q(x_1) - q(x_0)}{h_1} + f(x_1) + b(t_1) = 0 \quad (2)$$

$$\frac{q(x_2) - q(x_1)}{h_2} + f(x_2) + b(t_2) = 0$$

$$\vdots$$

$$\frac{q(x_n) - q(x_{n-1})}{h_n} + f(x_n) + b(t_n) = 0$$

Periodicity of the steady state solution x(t) requires that $x_0 = x_n$. Then the above equations (2) in matrix form become:

$$\begin{bmatrix} \frac{q(x_1) - q(x_n)}{h_1} + f(x_1) + b(t_1) \\ \frac{q(x_2) - q(x_1)}{h_2} + f(x_2) + b(t_2) \\ \vdots \\ \frac{q(x_n) - q(x_{n-1})}{h_n} + f(x_n) + b(t_n) \end{bmatrix} = \begin{bmatrix} 0 \\ 0 \\ \vdots \\ 0 \end{bmatrix} = F_{fd} \quad (3)$$

The above systems of equations (3) has nm equations in nm variables X where $$X = \begin{bmatrix} x_1 \\ x_2 \\ \vdots \\ x_n \end{bmatrix} \quad (4)$$

where m is the circuit size. Therefore, these equations (3) can be solved using Newton's method. The Jacobian (or Jacobian matrix) for the above system of equations (3) is:

$$J_{fd} = \begin{bmatrix} \frac{C_1}{h_1} + G_1 & 0 & \cdots & & -\frac{C_n}{h_1} \\ -\frac{C_1}{h_2} & \frac{C_2}{h_2} + G_2 & & & \\ & & \ddots & & \\ & & \cdots & 0 & -\frac{C_{n-1}}{h_n} & \frac{C_n}{h_n} + G_n \end{bmatrix} \quad (5)$$

where, $$C_i = \frac{\partial q}{\partial x}\bigg|_{x_i} \quad (6)$$

$$G_i = \frac{\partial f}{\partial x}\bigg|_{x_i}$$

Rather than solving the above system of equations (3) by direct factorization, Krylov subspace methods are used to solve these equations. The Jacobian $j_{fd}$ (5) can be written as:

$$J_{fd} = L + B \quad (7)$$

where $$L = \begin{bmatrix} \frac{C_1}{h_1} + G_1 & 0 & \cdots & 0 \\ -\frac{C_1}{h_2} & \frac{C_2}{h_2} + G_2 & & \\ & & \ddots & \\ & & \cdots & 0 & -\frac{C_{n-1}}{h_n} & \frac{C_n}{h_n} + G_n \end{bmatrix} \quad (8)$$

is the lower triangular part of $J_{fd}$ and $$B = \begin{bmatrix} 0 & 0 & \cdots & -\frac{C_N}{h_1} \\ 0 & 0 & & \\ & & \ddots & \\ & \cdots & 0 & 0 & 0 \end{bmatrix}. \quad (9)$$

Rather than solving $$J_{fd} \Delta F = -F_{fd} \quad (10),$$

the following equation (1) is solved:

$$L^{-1} J_{fd} \Delta x = (I + L^{-1} B) \Delta x = -L^{-1} F_{fd} \quad (11),$$

where I is a unity matrix. Since L is a block lower bi-diagonal matrix, the linear equations Lx=y such as equations (11) can be solved very efficiently ($O(nm^{1.3})$) using Krylov subspace methods. Note that the only computation involved is matrix vector products. The multiplication with $(I+L^{-1}B)$ can be performed very efficiently.

Periodic Steady-State Analysis of a Non-Autonomous Circuit Using Shooting Method Transient analysis is the solution of an initial value problem, for example, to solve equation (1) given an initial condition $x(t_0)$. Shooting methods are used for solving so-called boundary-valued problems where a desired solution $x(t_n)$ at some time point $t_n$ is given and the problem is to obtain the initial condition $x(t_0)$ and (optionally) the trajectory $x(t)$. The shooting method can be used to determine the steady-state solution of equation (1). The problem is to find $x_0$ such that at time T, $x_0 = x(T)$. The solution trajectory can be viewed as a function of both time t and the initial condition $x_0$, i.e., $$x(t) = \phi(t, x_0) \tag{12}$$

Therefore the shooting method equation can be written as $$F_{sh} = \phi(T, x_0) - x_0 = 0 \tag{13}.$$

The above equation (13) can be viewed as a nonlinear equation with m variables $x_0$ and therefore can be solved using Newton's method. The Jacobian (or Jacobian matrix) $J_{sh}$ for this system of equations (13) is:

$$J_{sh} = \frac{\partial \phi(T, x_0)}{\partial x_0} - I, \tag{14}$$

where I is a unity matrix.

In order to use Newton's method, $F_{sh}$ and $J_{sh}$ should be evaluated for a given $x_0$. $\phi(T, x_0)$ and therefore $F_{sh}$ can be evaluated by running transient analysis with an initial condition $x_0$ for time T. To evaluate $J_{sh}$, note that:

$$\frac{\partial \phi(T, x_0)}{\partial x_0} = \frac{\partial x_n}{\partial x_0} \tag{15}$$

Using chain rule, it follows that:

$$\frac{\partial x_n}{\partial x_0} = \prod_{i=1}^{n} \frac{\partial x_i}{\partial x_{i-1}} \tag{16}$$

To evaluate $$\frac{\partial x_i}{\partial x_{i-1}},$$

recall that $$\frac{q(x_i) - q(x_{i-1})}{h_i} + f(x_i) + b(t_i) = 0 \tag{17}$$

Differentiating the above equation (17) with respect to $x_{i-1}$, the following equation (18) is obtained:

$$\frac{C_i}{h_i} \frac{\partial x_i}{\partial x_{i-1}} - \frac{C_{i-1}}{h_i} + G_i \frac{\partial x_i}{\partial x_{i-1}} = 0, \tag{18}$$

which yields:

$$\frac{\partial x_i}{\partial x_{i-1}} = \left[ \frac{C_i}{h_i} + G_i \right]^{-1} \frac{C_{i-1}}{h_i}. \tag{19}$$

Therefore $$\frac{\partial x_n}{\partial x_0} = \prod_{i=1}^{n} \left[ \frac{C_i}{h_i} + G_i \right]^{-1} \frac{C_{i-1}}{h_i}. \tag{20}$$

In matrix form, equation (20) can be written as:

$$\begin{bmatrix} \frac{C_1}{h_1} + G_1 & 0 & \cdots & 0 \\ -\frac{C_1}{h_2} & \frac{C_2}{h_2} + G_2 & & \\ & & \ddots & \\ & \cdots & 0 & -\frac{C_{n-1}}{h_n} & \frac{C_n}{h_n} + G_n \end{bmatrix} \cdot \begin{bmatrix} \frac{\partial x_1}{\partial x_0} \\ \frac{\partial x_2}{\partial x_1} \\ \vdots \\ \frac{\partial x_n}{\partial x_{n-1}} \end{bmatrix} = \begin{bmatrix} \frac{C_0}{h_1} \\ 0 \\ \vdots \\ 0 \end{bmatrix}. \tag{21}$$

Note that:

$$\frac{C_i}{h_i} + G_i \tag{22}$$

is already factored during the transient solution phase. Therefore, the computational cost is dominated by factoring the Jacobian matrix, which is a dense matrix. This method therefore may be impractical for large size circuits. However, the following modifications facilitate the use of Krylov subspace methods for the shooting methods.

Recall in equation (11) that the preconditioned coefficient matrix for the finite difference method is:

$$I + L^{-1} B \tag{23}.$$

The last block column of $L^{-1}B$ is given by:

$$\begin{bmatrix} -\left[\frac{C_1}{h_1} + G_1\right]^{-1} \frac{C_n}{h_1} \\ -\left[\frac{C_2}{h_2} + G_2\right]^{-1} \frac{C_1}{h_2} \left[\frac{C_1}{h_1} + G_1\right]^{-1} \frac{C_n}{h_1} \\ \vdots \\ -\left(\prod_{i=2}^{n} \left[\frac{C_i}{h_i} + G_i\right]^{-1} \frac{C_{i-1}}{h_i}\right) \left[\frac{C_1}{h_1} + G_1\right]^{-1} \frac{C_n}{h_1} \end{bmatrix} \tag{24}$$

Note that in the above expansion (24), if $$\frac{C_n}{h_1}$$

is replaced by $$\frac{C_0}{h_1}$$

the last entry is $$-\frac{\partial x_n}{\partial x_0}.$$

This suggests that if the following equation (25), $$J_{sh}\delta x_0 = -f_{sh} \qquad (25),$$

where $\delta x_0$ is the difference in the value of $x_0$ between the k-th and (k+1)-th iterations of the Newton-Raphson method, is solved using a Krylov subspace method, the Jacobian matrix need not be explicitly formed and the matrix-vector product in the form of $J_{sh} \cdot y$ can be efficiently achieved as follows:

(i) Prepend (n−1)m zeros to y as follows:

$$\hat{y} = \begin{bmatrix} 0 \\ \vdots \\ 0 \\ y \end{bmatrix}. \qquad (26)$$

(ii) Form $y_1 = \hat{B}\hat{y}$ where $$\hat{B} = \begin{bmatrix} 0 & 0 & \cdots & \frac{C_0}{h_1} \\ 0 & 0 & & \\ & & \ddots & \\ \cdots & 0 & 0 & 0 \end{bmatrix}. \qquad (27)$$

(iii) Solve $L_{y2} = y_1$ using block forward substitution.

(iv) Form $y_2 - y$.

Periodic Steady-State Analysis of a Non-Autonomous Circuit Using Harmonic Balance Method Unlike the shooting method and the finite difference method that solve the differential algebraic equation (1) in time domain, the harmonic balance method solves the DAE (1) in frequency domain. Since the non-autonomous circuit is non-oscillatory, if the input signal is periodic with a period T, the steady-state solution x(t) and its function q(x) and f(x) are also periodic with a period T. Since these signals are T-periodic, they can be expanded in Fourier-series as follows:

$$b(t) = \sum_{i=-\infty}^{\infty} B_i \exp(j2\pi i f t), \qquad (28)$$

-continued $$x(t) = \sum_{i=-\infty}^{\infty} X_i \exp(j2\pi i f t), \qquad (29)$$

$$f(t) = \sum_{i=-\infty}^{\infty} F_i \exp(j2\pi i f t), \text{ and} \qquad (30)$$

$$q(t) = \sum_{i=-\infty}^{\infty} Q_i \exp(j2\pi i f t), \qquad (31)$$

where $$f = \frac{1}{T}.$$

The DAE (1) can be written in frequency-domain as:

$$\sum_{i=-\infty}^{\infty} [j2\pi i f Q_i + F_i + B_i] \exp(j2\pi i f t) = 0. \qquad (32)$$

Since $\exp(j2\pi i f t)$ is orthogonal, it follows that:

$$j2\pi i f Q_i + F_i + B_i = 0 \qquad (33)$$

for $\forall i$. In practice, the infinite summations are truncated to a finite number of harmonics k. Collocating the above equation at $i \in [-k, k]$, the following equations (34) follow:

$$2j\pi(-k)fQ_{-k} + F_{-k} + B_{-k} = 0 \qquad (34)$$
$$\vdots$$
$$j2\pi 0 f Q_0 + F_0 + B_0 = 0$$
$$\vdots$$
$$j2\pi k f Q_k + F_k + B_k = 0.$$

In matrix form, $$F_{hb} = j2\pi f\Omega Q + F + B = 0 \qquad (35),$$

where $\Omega = \text{diag}(-k \ldots 0 \ldots k)$ and $$Q = \begin{bmatrix} Q_{-k} \\ \vdots \\ Q_0 \\ \vdots \\ Q_k \end{bmatrix}, B = \begin{bmatrix} B_{-k} \\ \vdots \\ B_0 \\ \vdots \\ B_k \end{bmatrix}, F = \begin{bmatrix} F_{-k} \\ \vdots \\ F_0 \\ \vdots \\ F_k \end{bmatrix}, \text{ and } X = \begin{bmatrix} X_{-k} \\ \vdots \\ X_0 \\ \vdots \\ X_k \end{bmatrix}.$$

Equations (35) represents a system of m(2k+1) equations in m(2k+1) unknowns X which can be solved using Newton's method. The Jacobian matrix for equation (35) is given by:

$$J_{hb} = j2\pi f\Omega \frac{\partial Q}{\partial X} + \frac{\partial F}{\partial X}. \tag{36}$$

Therefore, given a X, the Q, F and the Jacobian $J_{hb}$ of the above system of equations (35) are evaluated.

The relationship between the various frequency domain quantities and time domain quantities is best illustrated by an example. Consider a circuit of size 2 and k=1. Then, equation (35) can be written as:

$$j2\pi f \begin{bmatrix} -1 & 0 & 0 & 0 & 0 & 0 \\ 0 & -1 & 0 & 0 & 0 & 0 \\ 0 & 0 & 0 & 0 & 0 & 0 \\ 0 & 0 & 0 & 0 & 0 & 0 \\ 0 & 0 & 0 & 0 & 1 & 0 \\ 0 & 0 & 0 & 0 & 0 & 1 \end{bmatrix} \begin{bmatrix} Q_{-1}^{(1)} \\ Q_{-1}^{(2)} \\ Q_0^{(1)} \\ Q_0^{(2)} \\ Q_1^{(1)} \\ Q_1^{(2)} \end{bmatrix} + \begin{bmatrix} F_{-1}^{(1)} \\ F_{-1}^{(2)} \\ F_0^{(1)} \\ F_0^{(2)} \\ F_1^{(1)} \\ F_1^{(2)} \end{bmatrix} + \begin{bmatrix} B_{-1}^{(1)} \\ B_{-1}^{(2)} \\ B_0^{(1)} \\ B_0^{(2)} \\ B_1^{(1)} \\ B_1^{(2)} \end{bmatrix} = \begin{bmatrix} 0 \\ 0 \\ 0 \\ 0 \\ 0 \\ 0 \end{bmatrix}, \tag{37}$$

where the superscripts in equation (37) denote the circuit variable index. Let P be a permutation matrix such that:

$$P \begin{bmatrix} Q_{-1}^{(1)} \\ Q_{-1}^{(2)} \\ Q_0^{(1)} \\ Q_0^{(2)} \\ Q_1^{(1)} \\ Q_1^{(2)} \end{bmatrix} = \begin{bmatrix} Q_{-1}^{(1)} \\ Q_0^{(1)} \\ Q_1^{(1)} \\ Q_{-1}^{(2)} \\ Q_0^{(2)} \\ Q_1^{(2)} \end{bmatrix}, \tag{38}$$

i.e., $$P = \begin{bmatrix} 1 & 0 & 0 & 0 & 0 & 0 \\ 0 & 0 & 1 & 0 & 0 & 0 \\ 0 & 0 & 0 & 0 & 1 & 0 \\ 0 & 1 & 0 & 0 & 0 & 0 \\ 0 & 0 & 0 & 1 & 0 & 0 \\ 0 & 0 & 0 & 0 & 0 & 1 \end{bmatrix}. \tag{39}$$

Let D denote the three point DFT (Discrete Fourier Transform) matrix, i.e., $$D = \begin{bmatrix} 1 & 1 & 1 \\ w^2 & 1 & w \\ w & 1 & w^2 \end{bmatrix}, \tag{40}$$

where $$w = \exp\left(j\frac{2}{3}\pi\right).$$

From equation (40), $$D^{-1} = \frac{1}{3} \begin{bmatrix} 1 & w & w^2 \\ 1 & 1 & 1 \\ 1 & w^2 & w \end{bmatrix}. \tag{41}$$

Let $$\tilde{D} = \begin{bmatrix} D & 0 \\ 0 & D \end{bmatrix} \tag{42}$$

where 0 in equation (42) is a 3×3 null matrix. Therefore, $$\tilde{D}PQ = \begin{bmatrix} D & 0 \\ 0 & D \end{bmatrix} \begin{bmatrix} Q_{-1}^{(1)} \\ Q_0^{(1)} \\ Q_1^{(1)} \\ Q_{-1}^{(2)} \\ Q_0^{(2)} \\ Q_1^{(2)} \end{bmatrix} = \begin{bmatrix} q_{t_1}^{(1)} \\ q_{t_2}^{(1)} \\ q_{t_3}^{(1)} \\ q_{t_1}^{(2)} \\ q_{t_2}^{(2)} \\ q_{t_3}^{(2)} \end{bmatrix}. \tag{43}$$

Multiplying the above equation (43) by $P^{-1}$, it follows:

$$P^{-1}\tilde{D}PQ = \begin{bmatrix} 1 & 0 & 0 & 0 & 0 & 0 \\ 0 & 0 & 0 & 1 & 0 & 0 \\ 0 & 1 & 0 & 0 & 0 & 0 \\ 0 & 0 & 0 & 0 & 1 & 0 \\ 0 & 0 & 1 & 0 & 0 & 0 \\ 0 & 0 & 0 & 0 & 0 & 1 \end{bmatrix} \begin{bmatrix} q_{t1}^{(1)} \\ q_{t2}^{(1)} \\ q_{t3}^{(1)} \\ q_{t1}^{(2)} \\ q_{t2}^{(2)} \\ q_{t3}^{(2)} \end{bmatrix} = \begin{bmatrix} q_{t1}^{(1)} \\ q_{t1}^{(2)} \\ q_{t2}^{(1)} \\ q_{t2}^{(2)} \\ q_{t3}^{(1)} \\ q_{t3}^{(2)} \end{bmatrix} = \hat{Q}. \tag{44}$$

This relationship in equation (44) can be used to compute the Jacobian $J_{hb}$.

$$\frac{\partial Q}{\partial X}$$

can be written in terms of its time-domain quantities as:

$$\frac{\partial Q}{\partial X} = \frac{\partial P^{-1}\tilde{D}^{-1}P\hat{Q}}{\partial X} = P^{-1}\tilde{D}^{-1}P\frac{\partial \hat{Q}}{\partial \hat{X}}P^{-1}\tilde{D}P. \tag{45}$$

Let C(t) be given by:

$$C(t) = \frac{\partial q}{\partial x}\bigg|_{x(t)}. \tag{46}$$

Define $$C = \begin{bmatrix} C(t_1) & 0 & 0 \\ 0 & C(t_2) & 0 \\ 0 & 0 & C(t_3) \end{bmatrix}. \quad (47)$$

Note that $$C = \frac{\partial \hat{Q}}{\partial \hat{X}}. \quad (48)$$

Therefore, the Jacobian becomes:

$$J_{hb} = j2\pi f\Omega P^{-1}\tilde{D}^{-1}PCP^{-1}\tilde{D}P + P^{-1}\tilde{D}^{-1}PGP^{-1}\tilde{D}P. \quad (49)$$

This Jacobian is large and dense and therefore storing, multiplying or factoring it is inefficient. However, if Krylov subspace methods are used to solve for:

$$J_{hb}\Delta X = -F_{hb}, \quad (50)$$

the only computation involved is matrix vector product. This can be achieved using permutations (no computation cost), Fourier transforms ($O(m(2k+1) \log(2k+1))$) and sparse matrix vector multiplications ($O(m(2k+1))$). Therefore, a properly preconditioned Krylov subspace method can quickly find the solution. For an appropriate choice of a preconditioner, assume that $C(ta)$ and $G(t)$ are constant. In this case, it follows that:

$$J_{hb_{avg}} = \begin{bmatrix} j2\pi(-k)fC_{avg} + G_{avg} & 0 & & \\ 0 & j2\pi(-(k-1))fC_{avg} + G_{avg} & 0 & \\ & & \ddots & \\ & & & j2\pi k C_{avg} + G_{avg} \end{bmatrix} \quad (51)$$

Therefore for problems with mold nonlinearity, the above matrix (51) is a good preconditioner for the Jacobian for the harmonic balance method.

Steady State Analysis of an Oscillator

The DAE for an oscillator is given by:

$$\frac{dq(x(t))}{dt} + f(x(t)) + b = 0. \quad (52)$$

The difference between the above equation (52) for an oscillator and equation (1) for a non-autonomous circuit is that b is a constant and that the period of oscillation is also an unknown in the above equation (52). Similar to the non-autonomous circuit case, the steady-state response can be computed either in time or in frequency domain.

Steady State Analysis of an Oscillator Using Finite Difference Method

Let the time period be discretized into n steps $h_1 \ldots, h_n$. Discretizing the differential operator using, for example, the Backward-Euler method, it follows:

$$\frac{q(x_1) - q(x_0)}{h_1} + f(x_1) + b = 0 \quad (53)$$

$$\frac{q(x_2) - q(x_1)}{h_2} + f(x_2) + b = 0$$

$$\vdots$$

$$\frac{q(x_n) - q(x_{n-1})}{h_n} + f(x_n) + b = 0.$$

Since $x_o = X_n$, it follows:

$$\frac{q(x_1) - q(x_n)}{h_1} + f(x_1) + b = 0 \quad (54)$$

$$\frac{q(x_2) - q(x_1)}{h_2} + f(x_2) + b = 0$$

$$\vdots$$

$$\frac{q(x_n) - q(x_{n-1})}{h_n} + f(x_n) + b = 0.$$

The above equations (54) can be solved using the Newton-Raphson method to obtain the steady-state response of the oscillator. However, unlike the non-autonomous circuit, the period T is unknown and therefore $h_1 \ldots, h_n$ are also unknown. One way to deal with the unknown $h_1 \ldots, h_n$ is to assume that:

$$\frac{h_i}{T} = \alpha_i \quad (55)$$

are fixed throughout the Newton iteration. $\alpha_i$'s can be predetermined by running an initial transient. This still leaves nm equations and nm+1 unknowns. This implies that there is a continuum of solutions for this problem and the Newton-Raphson method may not work because the solutions are non-isolated. In terms of equations, the Jacobian for the above equations (54) is singular at the solution with a rank deficiency of 1. This observation is consistent with the physical characteristics of the oscillator, because of the oscillator steady-state, if $x_s(t)$ is a solution, $x_s(t+\beta)$ is also a solution for any fixed $\beta$. In order to solve this problem, one of the variables is assigned a fixed value which fixes the phase and then the equations (54) can be solved.

Therefore, the system of equations becomes:

$$\frac{q(x_1) - q(x_n)}{h_1} + f(x_1) + b = 0 \quad (56)$$

$$\frac{q(x_2) - q(x_1)}{h_2} + f(x_2) + b = 0$$

$$\vdots$$

$$\frac{q(x_n) - q(x_{n-1})}{h_n} + f(x_n) + b = 0$$

$$x_{n_i} - x_{n_{i_0}} = 0,$$

with unknowns $$\begin{bmatrix} x_1 \\ x_2 \\ \vdots \\ x_n \\ T \end{bmatrix}. \quad (57)$$

The Jacobian for this system of equations (56) is:

$$\begin{bmatrix} \frac{C_1}{h_1}+G_1 & 0 & \cdots & & -\frac{C_n}{h_1} & -\frac{q(x_1)-q(x_n)}{h_1 T} \\ -\frac{C_1}{h_2} & \frac{C_2}{h_2}+G_2 & & & & -\frac{q(x_2)-q(x_1)}{h_2 T} \\ & & \ddots & & & \\ & \cdots & 0 & -\frac{C_{n-1}}{h_n} & \frac{C_n}{h_n}+G_n & -\frac{q(x_n)-q(x_{n-1})}{h_n T} \\ 0 & \cdots & 0 & \cdots & e_i^T & 0 \end{bmatrix}, \quad (58)$$

where $e_i$ is the i-th unit vector. The linear system can be efficiently solved using Krylov subspace methods using the lower triangular portion of the Jacobian as a preconditioner. Then the Krylov subspace method converges in nm+2 iterations where m is the circuit size.

Steady State Analysis of an Oscillator Using Shooting Method

The shooting method equations for the oscillator are written as:

$$\phi(x_0, 0, T) - x_0 = 0 \quad (59)$$

$$x_{0_i} - x_{0_{iD}} = 0,$$

where $\phi(x_0, 0, T)$ is the nonlinear state-transition function. The derivatives with respect to $x_0$ and $T$ are:

$$\frac{dx_n}{dx_0} = \prod_{i=1}^{n} \frac{dx_i}{dx_{i-1}} = \prod_{i=1}^{n} \left(\frac{C_i}{h_i}+G\right)^{-1} \frac{C_{i-1}}{h_i} \quad (60)$$

$$\frac{dx_i}{dT} = \left(\frac{C_i}{h_i}+G_i\right)^{-1} \left(\frac{C_{i-1}}{h_i}\frac{dx_{i-1}}{dT} + \frac{q(x_i)-q(x_{i-1})}{h_i T}\right).$$

In matrix notation, these equations (60) can be written as:

$$\begin{bmatrix} \frac{C_1}{h_1}+G_1 & & & \\ -\frac{C_1}{h_2} & \frac{C_2}{h_2}+G_2 & & \\ & & \ddots & \\ & & -\frac{C_{n-1}}{h_n} & \frac{C_n}{h_n}+G_n \end{bmatrix} \begin{bmatrix} \frac{dx_1}{dx_0} \\ \frac{dx_2}{dx_0} \\ \vdots \\ \frac{dx_n}{dx_0} \end{bmatrix} = \begin{bmatrix} \frac{C_0}{h_1} \\ 0 \\ \vdots \\ 0 \end{bmatrix} \text{ and} \quad (61)$$

-continued $$\begin{bmatrix} \frac{C_1}{h_1}+G_1 & & & \\ -\frac{C_1}{h_2} & \frac{C_2}{h_2}+G_2 & & \\ & & \ddots & \\ & & -\frac{C_{n-1}}{h_n} & \frac{C_n}{h_n}+G_n \end{bmatrix} \begin{bmatrix} \frac{dx_1}{dT} \\ \frac{dx_2}{dT} \\ \vdots \\ \frac{dx_n}{dT} \end{bmatrix} = \begin{bmatrix} \frac{q(x_1)-q(x_0)}{h_1 T} \\ \frac{q(x_2)-q(x_1)}{h_2 T} \\ \vdots \\ \frac{q(x_n)-q(x_{n-1})}{h_n T} \end{bmatrix}. \quad (62)$$

The Jacobian for the shooting equations for the oscillator is of the form:

$$\begin{bmatrix} \frac{dx_n}{dx_0} - I & \frac{dx_n}{dT} \\ 1 & 0 \end{bmatrix}. \quad (63)$$

Consider the finite difference Jacobian (58) multiplied with is preconditioner:

$$\begin{bmatrix} \frac{C_1}{h_1}+G_1 & 0 & \cdots & & 0 & 0 \\ -\frac{C_1}{h_2} & \frac{C_2}{h_2}+G_2 & & & & 0 \\ & & \ddots & & & \\ & \cdots & 0 & -\frac{C_{n-1}}{h_n} & \frac{C_n}{h_n}+G_n & 0 \\ 0 & \cdots & 0 & \cdots & 0 & 1 \end{bmatrix}^{-1} \quad (64)$$

$$\begin{bmatrix} \frac{C_1}{h_1}+G_1 & 0 & \cdots & & \frac{C_n}{h_1} & \frac{q(x_1)-q(x_n)}{h_1 T} \\ -\frac{C_1}{h_2} & \frac{C_2}{h_2}+G_2 & & & & \frac{q(x_2)-q(x_1)}{h_2 T} \\ & & \ddots & & & \\ & \cdots & 0 & \frac{C_{n-1}}{h_n} & \frac{C_n}{h_n}+G_n & \frac{q(x_n)-q(x_{n-1})}{h_n T} \\ 0 & \cdots & 0 & \cdots & 1 & 0 \end{bmatrix} =$$

$$\begin{bmatrix} I & 0 & \cdots & & -\frac{dx_1}{dx_0} & -\frac{dx_1}{dT} \\ 0 & I & \cdots & & -\frac{dx_2}{dx_0} & -\frac{dx_2}{dT} \\ & & \ddots & & & \\ 0 & & \cdots & I-\frac{dx_n}{dx_0} & -\frac{dx_n}{dT} \\ 0 & & \cdots & & 1 & 0 \end{bmatrix}.$$

Therefore, rather than directly solving the Jacobian, the following system (65) is solved using a Krylov subspace method:

$$\begin{bmatrix} 0 & 0 & \cdots & \frac{dx_1}{dx_0} & \frac{dx_1}{dT} \\ 0 & 0 & \cdots & \frac{dx_2}{dx_0} & \frac{dx_2}{dT} \\ & & \ddots & & \\ 0 & & \cdots & \frac{dx_n}{dx_0} & \frac{dx_n}{dT} \\ 0 & & \cdots & 1 & 0 \end{bmatrix} - \begin{bmatrix} I & 0 & \cdots & 0 & 0 \\ 0 & I & \cdots & 0 & 0 \\ & & \ddots & & \\ 0 & & \cdots & I & 0 \\ 0 & & \cdots & 0 & 0 \end{bmatrix}. \quad (65)$$

The initial condition and the period are the last m+1 variables of this system of equations (65) and all others are discarded.

Steady State Analysis of an Oscillator Using Harmonic Balance Method

Let $$\omega_0 = \frac{2\pi}{T}.$$

Since the steady state solution x(t) is periodic with a period of T.

$$x(t) = \sum_{i=-\infty}^{\infty} X_i \exp(ji\omega_0 t). \quad (66)$$

Assume that the Fourier series is truncated to the k-th harmonic, i.e., $$x(t) \approx \sum_{i=-k}^{k} X_i \exp(ji\omega_0 t). \quad (67)$$

Collocating the equations at these 2k+1 harmonics, it follows:

$$jw\Omega Q + F + B = 0 \quad (68),$$

where $\Omega$, Q, F and B were defined hereinabove. Similar to the time domain case, there is a continuum of solutions and in order for the Newton-Raphson to be used, one condition is fixed, for example, $X_i = X_{i0}$. This can be determined by DC analysis. The combined set of equations to be solved is:

$$\begin{bmatrix} jw\Omega Q + F + B \\ X_i - X_{i_0} \end{bmatrix} = \begin{bmatrix} 0 \\ 0 \end{bmatrix}, \quad (69)$$

with unknowns $$\begin{bmatrix} X \\ w \end{bmatrix}. \quad (70)$$

The Jacobian for this system of equations is:

$$\begin{bmatrix} j2\pi f \Omega P^{-1} \tilde{D}^{-1} PCP^{-1} \tilde{D} P + P^{-1} \tilde{D}^{-1} PGP^{-1} \tilde{D} P & j\Omega Q \\ e_i^T & 0 \end{bmatrix} \quad (71)$$

where P, $\tilde{D}$, C and G were defined hereinabove. The matrix equations (69) can be solved efficiently using a Krylov subspace method. The preconditioner in equation (51) for the regular harmonic balance for a non-autonomous circuit, appended with an extra row and column with 1 as the diagonal entry in the last column and row works well.

Figure 3:
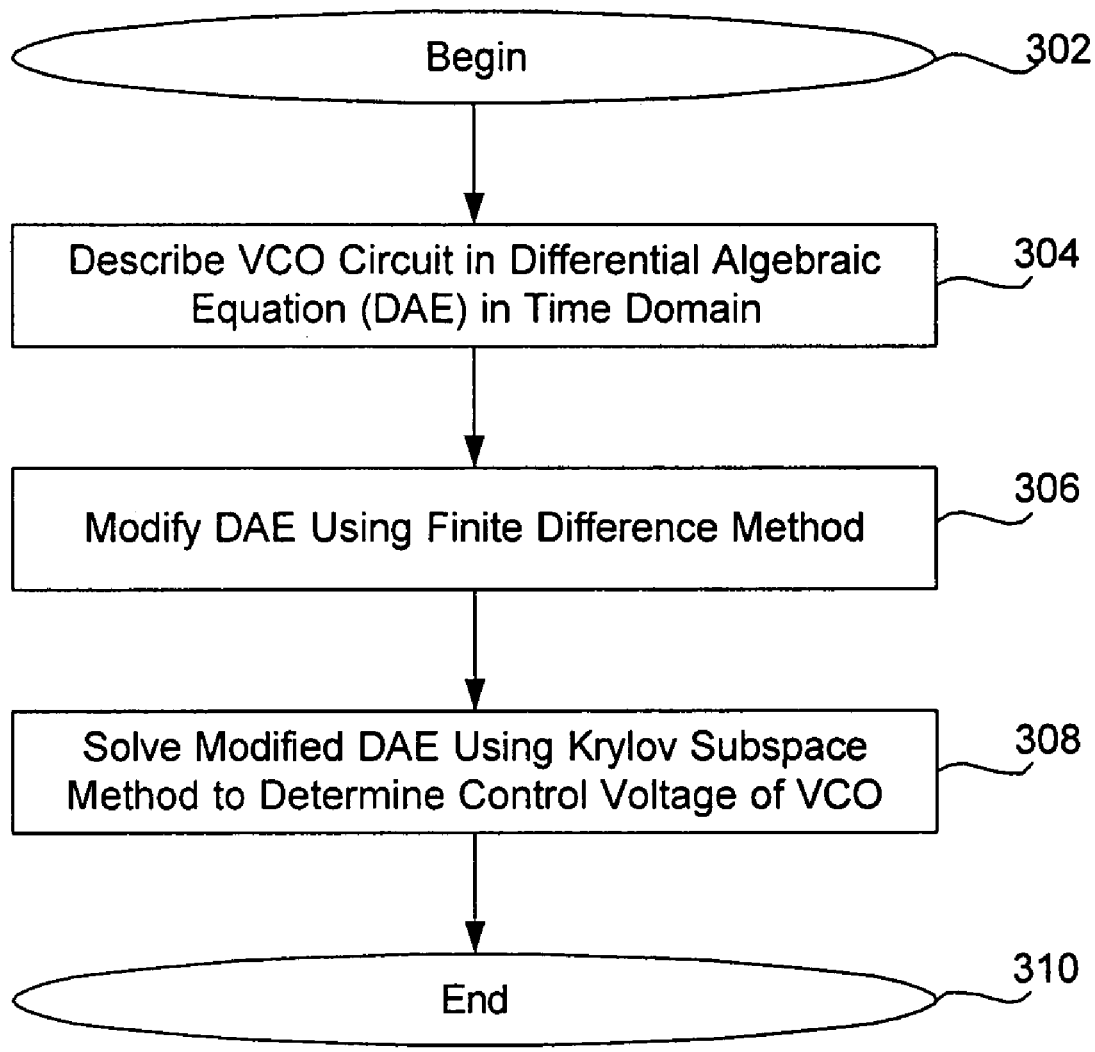
FIG. 3 is a flow chart illustrating a method of determining the control voltage of the VCO by steady state analysis of the VCO using a finite difference method, according to one embodiment of the present invention.

Steady State Analysis of a Voltage Controlled Oscillator Using Finite Difference Method FIG. 3 is a flow chart illustrating a method of determining the control voltage of the VCO by steady state analysis of the VCO using a finite difference method, according to one embodiment of the present invention. In a VCO, one of the independent sources can be varied to change the frequency of oscillation.

As the method begins 302, the circuit simulation engine 204 describes 304 the VCO circuit with a set of DAEs in time domain. The DAEs for the VCO becomes:

$$\frac{dq(x)}{dt} + f(x) + b + ce = 0, \quad (72)$$

where b is a vector representative of the independent sources of the VCO except the control source of the VCO, which is represented by the vector ce. Here c is a scalar and e is a vector with either one or two nonzero entries which can be either 1 or −1. If e has two nonzero entries, one of them is 1 and the other one is −1. The problem is to find the control voltage scalar c of the VCO for a given period T (or a given frequency of oscillation. An extra condition, i.e., the phase condition, for the extra unknown c is needed.

The simulation engine 204 modifies 306 the DAE (72) for the VCO using the finite difference method, as follows:

$$\frac{q(x_1) - q(x_n)}{h_1} + f(x_1) + b + ce = 0 \quad (73)$$

$$\frac{q(x_2) - q(x_1)}{h_2} + f(x_2) + b + ce = 0$$

$$\vdots$$

$$\frac{q(x_n) - q(x_{n-1})}{h_n} + f(x_n) + b + ce = 0$$

$$x_{n_i} - x_{n_{i_0}} = 0$$

with unknowns $$\begin{bmatrix} x_1 \\ x_2 \\ \vdots \\ x_n \\ c \end{bmatrix}. \quad (74)$$

The Jacobian for this system of equations (73) is:

$$\begin{bmatrix} \frac{C_1}{h_1} + G_1 & 0 & \cdots & & -\frac{C_n}{h_1} & e \\ -\frac{C_1}{h_2} & \frac{C_2}{h_2} + G_2 & & & & e \\ & & \ddots & & & \\ & & \cdots & 0 & -\frac{C_{n-1}}{h_n} & \frac{C_n}{h_n} + G_n & e \\ 0 & \cdots & 0 & \cdots & 1 & 0 \end{bmatrix} \quad (75)$$

The linear system of equations (73) can be efficiently solved 308 by the simulation engine 204 using Krylov subspace methods using the lower triangular portion of the Jacobian (75) as a preconditioner, and the method ends 310.

Figure 4:
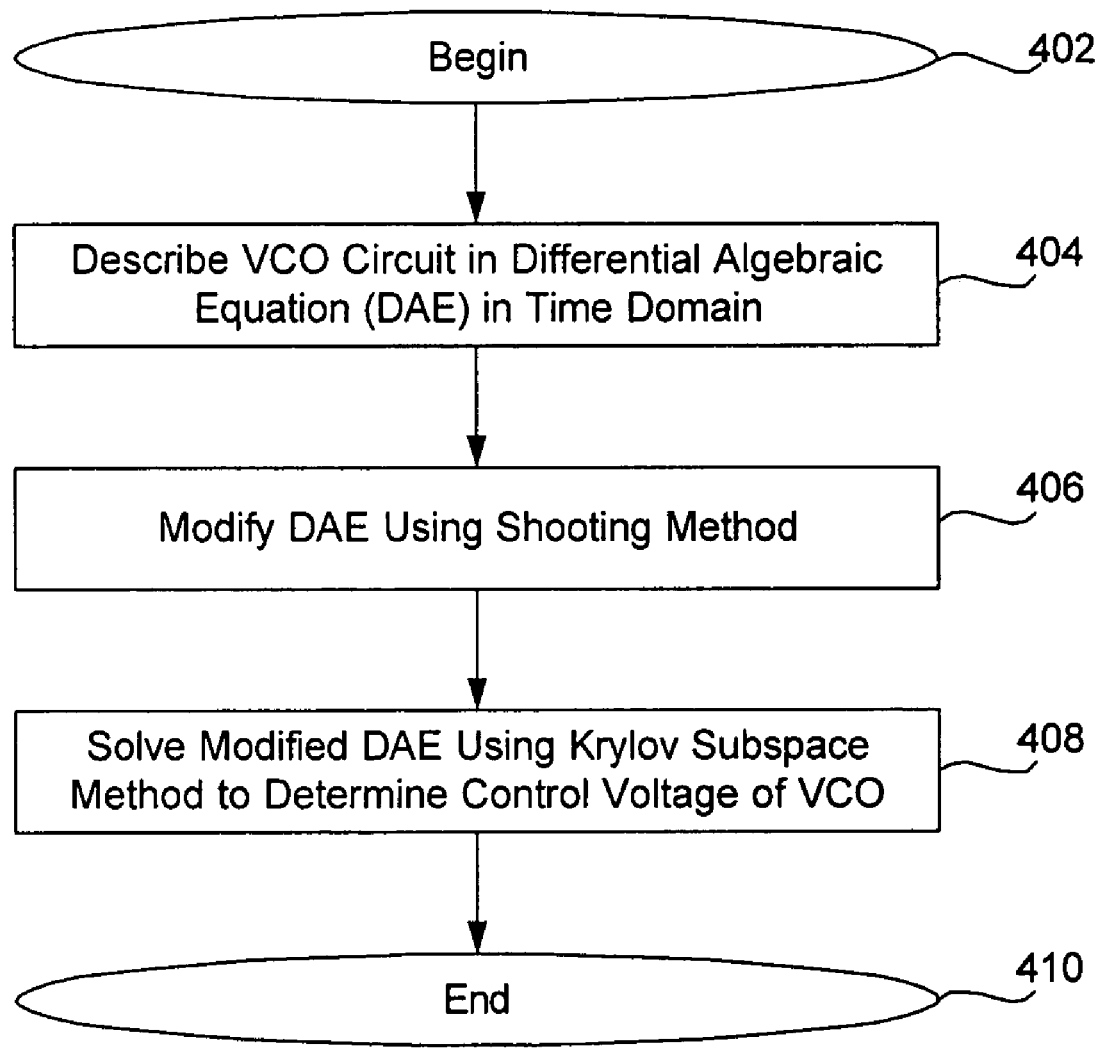
FIG. 4 is a flow chart illustrating a method of determining the control voltage of the VCO by steady state analysis of the VCO using a shooting method, according to one embodiment of the present invention.

Steady State Analysis of a Voltage Controlled Oscillator Using Shooting Method FIG. 4 is a flow chart illustrating a method of determining the control voltage of the VCO by steady state analysis of the VCO using a shooting method, according to one embodiment of the present invention. As the method begins, the simulation engine 204 describes 404 the DAE for the VCO in time domain as shown in equation (72).

The simulation engine 204 modifies 406 the DAE in equation (72) using the shooting method. To this end, the shooting equations for the VCO are written as:

$$\phi(x_0,0,T)-x_0=0 \qquad (76)$$

and $$x_{0_I}-x_{0_{I_0}}=0 \qquad (77),$$

where $\phi(x_0,0,T)$ is the nonlinear state-transition function. The derivatives with respect to $x_0$ and $c$ can be written as:

$$\frac{dx_n}{dx_0}\prod_{i=1}^{n}\frac{dx_i}{dx_{i-1}} = \prod_{i=1}^{n}\left(\frac{C_i}{h_i}+G_i\right)^{-1}\frac{C_{i-1}}{h_i} \qquad (78)$$

$$\frac{dx_i}{dc} = \left(\frac{C_i}{h_i}+G_i\right)^{-1}\left(\frac{C_{i-1}}{h_i}\frac{dx_{i-1}}{dT}-e\right).$$

In matrix notation, these equations (78) can be written as:

$$\begin{bmatrix} \frac{C_1}{h_1}+G_1 & & & \\ -\frac{C_1}{h_2} & \frac{C_2}{h_2}+G_2 & & \\ & & \ddots & \\ & & -\frac{C_{n-1}}{h_n} & \frac{C_n}{h_n}+G_n \end{bmatrix}\begin{bmatrix} \frac{dx_1}{dx_0} \\ \frac{dx_2}{dx_0} \\ \vdots \\ \frac{dx_n}{dx_0} \end{bmatrix} = \begin{bmatrix} \frac{C_0}{h_1} \\ 0 \\ \vdots \\ 0 \end{bmatrix} \qquad (79)$$

$$\begin{bmatrix} \frac{C_1}{h_1}+G_1 & & & \\ -\frac{C_1}{h_2} & \frac{C_2}{h_2}+G_2 & & \\ & & \ddots & \\ & & -\frac{C_{n-1}}{h_n} & \frac{C_n}{h_n}+G_n \end{bmatrix}\begin{bmatrix} \frac{dx_1}{dc} \\ \frac{dx_2}{dc} \\ \vdots \\ \frac{dx_n}{dc} \end{bmatrix} = \begin{bmatrix} e \\ e \\ \vdots \\ e \end{bmatrix}.$$

The Jacobian for the VCO for the shooting method is of the form:

$$\begin{bmatrix} \frac{dx_n}{dx_0}-I & \frac{dx_n}{dc} \\ 1 & 0 \end{bmatrix}. \qquad (80)$$

Consider the finite difference Jacobian (75) multiplied with its preconditioner:

$$\begin{bmatrix} \frac{C_1}{h_1}+G_1 & 0 & \cdots & 0 & 0 \\ -\frac{C_1}{h_2} & \frac{C_2}{h_2}+G_2 & & & 0 \\ & & \ddots & & \\ & \cdots & 0 & -\frac{C_{n-1}}{h_n} & \frac{C_n}{h_n}+G_n & 0 \\ 0 & \cdots & 0 & \cdots & 0 & 1 \end{bmatrix}^{-1} \begin{bmatrix} \frac{C_1}{h_1}+G_1 & 0 & \cdots & -\frac{C_n}{h_1} & e \\ -\frac{C_1}{h_2} & \frac{C_2}{h_2}+G_2 & & & e \\ & & \ddots & & \\ & \cdots & 0 & -\frac{C_{n-1}}{h_n} & \frac{C_n}{h_n}+G_n & e \\ 0 & \cdots & 0 & \cdots & 1 & 0 \end{bmatrix} = \qquad (81)$$

$$\begin{bmatrix} I & 0 & \cdots & -\frac{dx_1}{dx_0} & -\frac{dx_1}{dc} \\ 0 & I & \cdots & -\frac{dx_2}{dx_0} & -\frac{dx_2}{dc} \\ & & \ddots & & \\ 0 & & \cdots & I-\frac{dx_n}{dx_0} & -\frac{dx_n}{dc} \\ 0 & & \cdots & 1 & 0 \end{bmatrix}.$$

Therefore instead of directly solving the Jacobian, the following system (82) is solved 408 by the simulation engine 204, using the Krylov subspace method:

$$\begin{bmatrix} 0 & 0 & \cdots & \frac{dx_1}{dx_0} & \frac{dx_1}{dc} \\ 0 & 0 & \cdots & \frac{dx_2}{dx_0} & \frac{dx_2}{dc} \\ & & \ddots & & \\ 0 & & \cdots & \frac{dx_n}{dx_0} & \frac{dx_n}{dc} \\ 0 & & \cdots & 1 & 0 \end{bmatrix} - \begin{bmatrix} I & 0 & \cdots & 0 & 0 \\ 0 & I & \cdots & 0 & 0 \\ & & \ddots & & \\ 0 & & \cdots & I & 0 \\ 0 & & \cdots & 0 & 0 \end{bmatrix}, \qquad (82)$$

and the method ends 410. The initial condition and the period are the last $m+1$ variables of this system (82) and all others are discarded.

Figure 5:
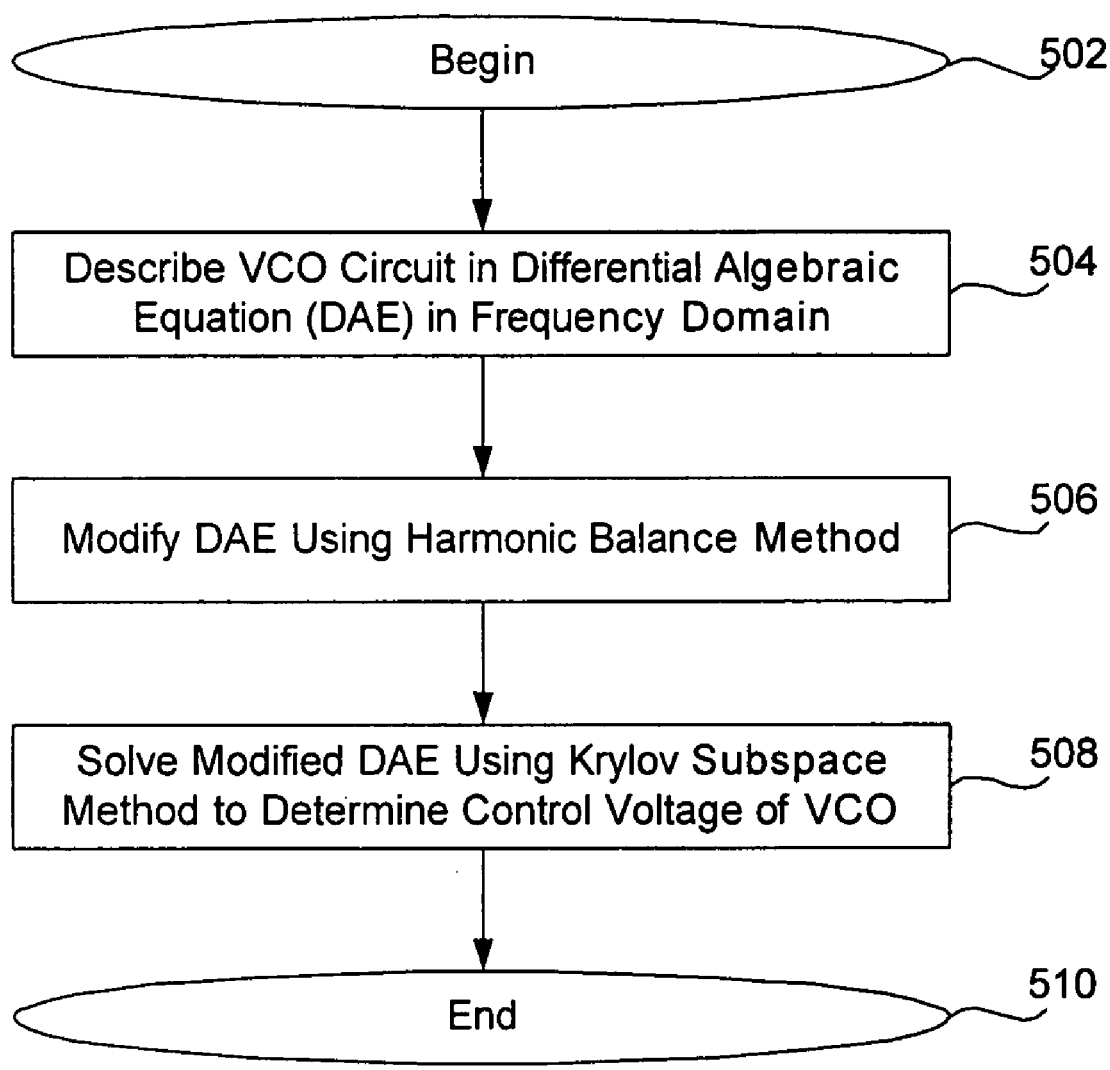
FIG. 5 is a flow chart illustrating a method of determining the control voltage of the VCO by steady state analysis of the VCO using a harmonic balance method, according to one embodiment of the present invention.

Steady State Analysis of a Voltage Controlled Oscillator Using Harmonic Balance Method FIG. 5 is a flow chart illustrating a method of determining the control voltage of the VCO by steady state analysis of the VCO using a harmonic balance method, according to one embodiment of the present invention. As the method begins 502, the simulation engine 204 describes 504 the steady state equations for the VCO in frequency domain with the extra phase conditions as follows:

$$\begin{bmatrix} jw\Omega Q + F + B \\ X_i - X_{i_0} \end{bmatrix} = \begin{bmatrix} 0 \\ 0 \end{bmatrix}. \qquad (83)$$

Since the VCO does not have any periodic inputs, $$B = \begin{bmatrix} \vdots \\ 0 \\ b+ce \\ 0 \\ \vdots \end{bmatrix}, \qquad (84)$$

with unknowns $$\begin{bmatrix} X \\ c \end{bmatrix}. \tag{85}$$

As before, b is a vector of the independent sources of the VCO except the control source of the VCO, which is represented by the vector ce. Here c is a scalar and e is a vector with either one or two nonzero entries which can be either 1 or −1. If e has two nonzero entries, one of them is 1 and the other one is −1. The problem is to find the control voltage scalar c of the VCO with a given period T (or a given frequency of oscillation).

The simulation engine 204 modifies 506 the equations (83) using the harmonic balance method. Specifically, the Jacobian for this system of equations (83) is:

$$\begin{bmatrix} j2\pi f\Omega P^{-1}\tilde{D}^{-1}PCP^{-1}\tilde{D}P + P^{-1}\tilde{D}^{-1}PGP^{-1}\tilde{D}P & \begin{bmatrix} \vdots \\ 0 \\ e \\ 0 \\ \vdots \end{bmatrix} \\ e_i^T & 0 \end{bmatrix}. \tag{84}$$

where P, $\tilde{D}$, C and G are as defined hereinabove. The matrix equations (83) can be solved 508 efficiently using a Krylov subspace method, and the method ends 510. The preconditioner in equation (51) for the regular harmonic balance method for a non-autonomous circuit, appended with an extra row and column with 1 as the diagonal entry in the last column and row works well as the preconditioner.

The steady state analysis of a VCO according to the present invention has the advantage that the steady state and the control voltage that result in a given frequency or period of oscillation can be efficiently computed. Unlike conventional steady state analysis of VCOs that cannot calculate the control voltage directly, the steady state analysis of a VCO according to the present invention can compute the control voltage and steady state directly, within much shorter runtime, and in an accurate manner.

Although the present invention has been described above with respect to several embodiments, various modifications can be made within the scope of the present invention. For example, although the present invention is described herein in terms of a voltage controlled oscillator, the present invention can also be applied to determine the steady state and control current of a current controlled oscillator. Accordingly, the disclosure of the present invention is intended to be illustrative, but not limiting, of the scope of the invention, which is set forth in the following claims.

What is claimed is:

1. A computer-implemented method of computing a steady state of a voltage controlled oscillator, the method comprising the steps of:

generating a set of one or more differential algebraic equations representative of the of an electronic circuit, for analysis of the voltage controlled oscillator, the set of one or more differential algebraic equations including a known period or a known frequency of oscillation of the voltage controlled oscillator and an unknown control voltage of the voltage controlled oscillator that generates the period or the frequency of oscillation;

modifying the set of one or more differential algebraic equations to obtain a set of one or more matrix equations corresponding to the differential algebraic equations; and obtaining a solution to the set of one or more matrix equations using a Krylov subspace method, the solution including the control voltage of the voltage controlled oscillator in steady state, wherein the set of one or more differential algebraic equations is in the form of:

$$\frac{dq(x)}{dt} + f(x) + b + ce = 0,$$

where x represents a steady state solution, t represents time, q(x) and f(x) represent parameters of the voltage controlled oscillator that are functions of the steady state solution, b represents an independent source of the voltage controlled oscillator except a control source, and ce represents the control source of the voltage controlled oscillator wherein c is a control voltage scalar and e is a vector with one or two nonzero entries that are either 1 or −1.

2. The computer-implemented method of claim 1, wherein the set of one or more differential algebraic equations is modified using a finite difference method in time domain to obtain the set of one or more matrix equations.

3. The computer-implemented method of claim 1, wherein the set of one or more differential algebraic equations is modified using a shooting method in time domain to obtain the set of one or more matrix equations.

4. The computer-implemented method of claim 1, wherein the set of one or more differential algebraic equations is modified using a harmonic balance method in frequency domain to obtain the set of one or more matrix equations.

5. The computer-implemented method of claim 1, wherein the step of modifying the set of one or more differential algebraic equations comprises obtaining a Jacobian matrix corresponding to the set of one or more matrix equations, the set of one or more matrix equations being solved using the Krylov subspace method with a preconditioner for the Krylov subspace method being derived at least in part from the Jacobian matrix.

6. A computer system configured to compute the steady state of a voltage controlled oscillator, the computer system comprising:

a model equations storage module storing a plurality of differential algebraic equations corresponding to a plurality of circuit components of the voltage controlled oscillator; and a circuit simulation engine coupled to the model equations storage module configured to:

generate a set of one or more differential algebraic equations representative of the of an electronic circuit, for analysis of the voltage controlled oscillator, the set of one or more differential algebraic equations including a known period or a known frequency of oscillation of the voltage controlled oscillator and an unknown control voltage of the voltage controlled oscillator that generates the period or the frequency of oscillation;

modify the set of one or more differential algebraic equations to obtain a set of one or more matrix equations corresponding to the differential algebraic equations; and obtain a solution to the set of one or more matrix equations using a Krylov subspace method, the solution including the control voltage of the voltage controlled oscillator in steady state wherein the set of one or more differential algebraic equations is in the form of:

$$\frac{dq(x)}{dt} + f(x) + b + ce = 0,$$

where x represents a steady state solution, t represents time, q(x) and f(x) represent parameters of the voltage controlled oscillator that are functions of the steady state solution, b represents an independent source of the voltage controlled oscillator except a control source, and ce represents the control source of the voltage controlled oscillator wherein c is a control voltage scalar and e is a vector with one or two nonzero entries that are either 1 or −1.

7. The computer system of claim 6, wherein the circuit simulation engine modifies the set of one or more differential algebraic equations using a finite difference method in time domain to obtain the set of one or more matrix equations.

8. The computer system of claim 6, wherein the circuit simulation engine modifies the set of one or more differential algebraic equations using a shooting method in time domain to obtain the set of one or more matrix equations.

9. The computer system of claim 6, wherein the circuit simulation engine modifies the set of one or more differential algebraic equations using a harmonic balance method in frequency domain to obtain the set of one or more matrix equations.

10. The computer system of claim 6, wherein the circuit simulation engine obtains a Jacobian matrix corresponding to the set of one or more matrix equations, the set of one or more matrix equations being solved using the Krylov subspace method with a preconditioner for the Krylov subspace method being derived at least in part from the Jacobian matrix.

11. A computer readable medium storing a computer program product configured to perform a computer-implemented method of computing the steady state of a voltage controlled oscillator, the method comprising the steps of:

generating a set of one or more differential algebraic equations representative of the of an electronic circuit, for analysis of the voltage controlled oscillator, the set of one or more differential algebraic equations including a known period or a known frequency of oscillation of the voltage controlled oscillator and an unknown control voltage of the voltage controlled oscillator that generates the period or the frequency of oscillation;

modifying the set of one or more differential algebraic equations to obtain a set of one or more matrix equations corresponding to the differential algebraic equations; and obtaining a solution to the set of one or more matrix equations using a Krylov subspace method, the solution including the control voltage of the voltage controlled oscillator in steady state, wherein the set of one or more differential algebraic equations is in the form of:

$$\frac{dq(x)}{dt} + f(x) + b + ce = 0,$$

where x represents a steady state solution, t represents time, q(x) and f(x) represent parameters of the voltage controlled oscillator that are functions of the steady state solution, b represents an independent source of the voltage controlled oscillator except a control source, and ce represents the control source of the voltage controlled oscillator wherein c is a control voltage scalar and e is a vector with one or two nonzero entries that are either 1 or −1.

12. The computer readable medium of claim 11, wherein the set of one or more differential algebraic equations is modified using a finite difference method in time domain to obtain the set of one or more matrix equations.

13. The computer readable medium of claim 11, wherein the set of one or more differential algebraic equations is modified using a shooting method in time domain to obtain the set of one or more matrix equations.

14. The computer readable medium of claim 11, wherein the set of one or more differential algebraic equations is modified using a harmonic balance method in frequency domain to obtain the set of one or more matrix equations.

15. The computer readable medium of claim 11, wherein the step of modifying the set of one or more differential algebraic equations further comprises obtaining a Jacobian matrix corresponding to the set of one or more matrix equations, the set of one or more matrix equations being solved using the Krylov subspace method with a preconditioner for the Krylov subspace method being derived at least in part from the Jacobian matrix.

* * * * *

UNITED STATES PATENT AND TRADEMARK OFFICE
CERTIFICATE OF CORRECTION

| | |
|---|---|
| PATENT NO. | : 7,332,974 B1 |
| APPLICATION NO. | : 11/045241 |
| DATED | : February 19, 2008 |
| INVENTOR(S) | : Amit Mehrotra and Amit Narayan |

It is certified that error appears in the above-identified patent and that said Letters Patent is hereby corrected as shown below:

Column 21, Line 61, add --voltage controlled oscillator-- between "equations representative of the" and "of an electronic circuit,"

Column 22, Line 56, add --voltage controlled oscillator-- between "equations representative of the" and "of an electronic circuit,"

Column 23, Line 4, add a comma --,-- after "in steady state"

Column 23, Line 44, add --voltage controlled oscillator-- between "equations representative of the" and "of an electronic circuit,"

Signed and Sealed this

Tenth Day of June, 2008

JON W. DUDAS
*Director of the United States Patent and Trademark Office*